United States Patent [19]

Yung

[11] Patent Number: 5,696,587
[45] Date of Patent: Dec. 9, 1997

[54] METAL TARGET FOR LASER REPAIR OF DIES

[75] Inventor: C. Y. Yung, Hsin-Chu, Taiwan

[73] Assignee: United Microelectronics Corporation, Taiwan

[21] Appl. No.: 355,785

[22] Filed: Dec. 14, 1994

[51] Int. Cl.⁶ .................................................. G01B 11/00
[52] U.S. Cl. .................................. 356/375; 354/401
[58] Field of Search .............................. 356/375, 401; 437/924

[56] References Cited

U.S. PATENT DOCUMENTS 5,414,519  5/1995  Han .................................. 356/401

FOREIGN PATENT DOCUMENTS 63-119528  5/1988  Japan .................................. 437/924

Primary Examiner—F. L. Evans
Attorney, Agent, or Firm—Barnes,Kisselle, Raisch, Choate, Whittemore &Hulbert,P.C.

[57] ABSTRACT

Improved metal targets deposited on the surface of an IC chip for determining a reference coordinate in a laser repair apparatus for calculating the actual coordinates of a repair site in the shape of rectangular bars for occupying a smaller space on the surface of an integrated circuit chip and for enabling a simplified process for determining the actual coordinates.

4 Claims, 2 Drawing Sheets

METAL TARGET FOR LASER REPAIR OF DIES

FIELD OF THE INVENTION

The present invention generally relates to metal targets used as a reference coordinate on an integrated circuit die for laser repair and more particularly, relates to improved metal targets used as a reference coordinate on an integrated circuit die for a laser repair process that do not occupy a large space on the die and capable of providing a quicker repair process of the die.

BACKGROUND OF THE INVENTION

In the manufacturing of semiconductor chips, electronic structures are built into the surface of a substrate of a die. Since extremely complex electronic circuitries are involved, some defects are inevitably built into the die during manufacturing. These defects become defects on the semiconductor chips when the chips are severed from the die. The production of defective semiconductor chips affects the through-put of a chip manufacturing process.

Defects in integrated circuit (IC) chips cause special problems in the manufacturing of large volume, high cost chips such as SRAM chips. In order to save expensive chips from being scraped for a minor defect, a chip designer usually builds a number of redundancy fuses into the architecture of the circuit such that repair procedures may be taken to correct the defect. In repairing a miniaturized circuitry on a semiconductor chip, laser is frequently used such that energy may be focused to a minute point to aim at an exact target of repair without causing other damages.

To carry out a laser repair process, it is necessary to first install metal targets on an IC chip for use as reference coordinates. Aluminum, because of its easy processability, is frequently chosen as the target material. The laser repair apparatus detects the locations of the metal targets and use them as reference coordinates to calculate the actual coordinates of the location of the designated repair such that a laser beam can be pinpointed to the repair site.

Conventionally, metal targets for laser in an "L" shape are used on the surface of an IC ship for the laser repair apparatus to fix the X:Y coordinate. This is shown in FIG. 1. At least a pair of "L" shaped targets are normally placed on the surface of an IC chip. The centerlines of the two arms of the "L" section intersects at a point which provides the coordinate (X, Y) of the metal target. A response curve 12 which shows the intensity of the laser reflected during a laser scan in the X direction is shown in FIG. 1, while a similar curve 14 obtained in the Y direction during a laser scan is also shown.

In order for the laser scanning process to function properly, the area immediately adjacent to the metal target must be free of any metal material and is designated as a clear area 16. Any metal existing in the clear area 16 causes a reflection of the laser beam and leads to false readings of the coordinates. As shown in FIG. 1, a minimum clearance of A is required from the "L" shaped target such that accurate readings of the coordinates can be obtained. A nominal value for A is approximately 20 microns. The total clear area necessary for the "L" shaped metal target shown in FIG. 1 is calculated to be approximately 320 micron$^2$.

In the growing trend of miniaturization of integrated circuit chips, any available space on the chip surface is becoming a premium. It is increasingly difficult to find spaces on the surface of an IC chip that is large enough to place an "L" shaped metal target as reference coordinates in laser repair process.

It is therefore an object of the present invention to provide an improved metal target that does not have the drawbacks of the prior art targets used as reference points on an IC chip.

It is another object of the present invention to provide an improved metal target for use on an IC chip in a laser repair process to provide accurate readings of a reference coordinate.

It is a further object of the present invention to provide an improved metal target for use on an IC chip in a laser repair process such that the metal target does not require a large space on the surface of the IC chip.

It is yet another object of the present invention to provide an improved metal target for use on an IC chip in a laser repair process that is capable of providing shortened time required for setting the reference point.

SUMMARY OF THE INVENTION

In accordance with the present invention, an improved metal target for use as a reference point in a laser repair process for repairing defects on an IC chip that does not have the shortcomings of the prior art metal targets is provided.

In a preferred embodiment, rectangular shaped metal targets are placed on the surface of an IC chip without occupying an excessively large area. When a suitable number of these rectangular shaped targets are used, the total time required to read the reference points on the surface of the IC chip can be reduced. For instance, when three rectangular shaped metal targets are placed on the surface of an IC chip with one positioned horizontally and two positioned vertically, only three readings by laser scanning are necessary to set a reference point coordinate. This is compared to a conventional method of using two "L" shaped metal targets in which at least four readings are necessary to set a reference point. A 25% saving in processing time savings can be realized.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED AND THE ALTERNATIVE EMBODIMENTS

The present invention discloses an improved metal target used on an IC chip as reference coordinates in a laser repair process for defects in the IC circuit. In a modern miniaturized chip, i.e., an SRAM chip having a high density layout of the circuitry on sub-micron bases, redundancy fuses are built into the circuitry in rows and columns. An integrated circuit chip with minor defects can be repaired by using a focused laser beam to burn out some of the fuses and thereby circumvents the defective circuit and completes its repair mission.

To enable the laser repair process, conventionally two "L" shaped metal targets are incorporated onto the surface of an IC chip to serve as reference coordinates. A laser repair apparatus reads these reference coordinates and calculates the actual coordinates of the designated repair site to be performed in order to accomplish the repair mission.

In a modern, high density IC chip where the architecture is designed down to a sub-micron level, it is difficult to find a space on the chip that is large enough to accomodate a conventional "L" shaped metal target. It is even more difficult when two or three such metal targets must be fitted on a single IC chip.

Figure 2:
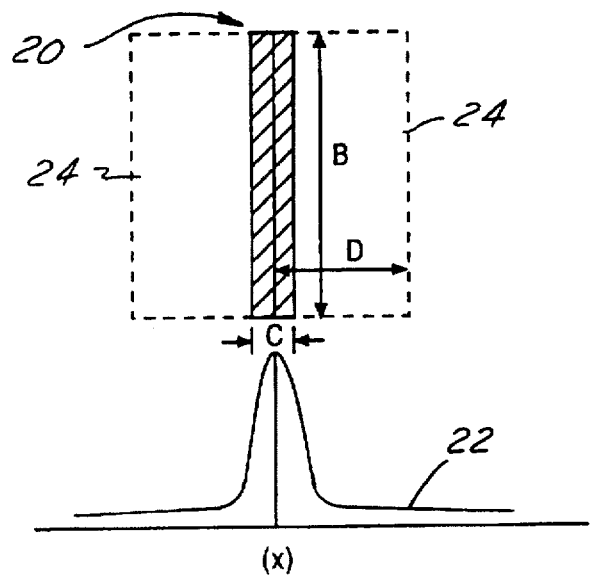
FIG. 2 is a plane view of the present invention metal target for the X coordinate and a corresponding laser scan graph.
Figure 3:
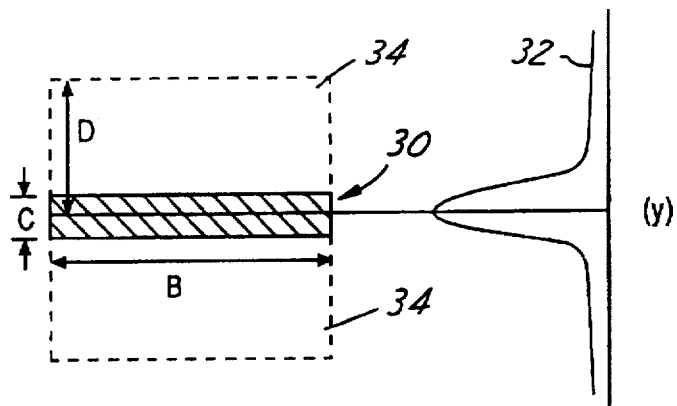
FIG. 3 is a plane view of the present invention metal target for the Y coordinate and a corresponding laser scan graph.

The present invention metal target is designed in a rectangular shape as shown in FIGS. 2 and 3. The metal target 20 shown in FIG. 2 has a length B of approximately 40 microns, a width C of approximately 6 microns and a thickness of approximately 1 micron. It is in a rectangular shape and therefore requires a smaller deposition space compared to the conventional "L" shaped metal target. It has been found that for a modern IC chip, it is desirable to use rectangular shaped metal target having a length in the range between 20 to 40 microns, a width in the range between 4 to 8 microns, and a thickness in the range between 0.1 to 5 microns. An intensity response curve 22 obtained during a laser scan in the X direction is also shown in FIG. 2. The response curve 22 shows a maximum intensity of the scan at the X coordinate. For the metal target 20 to work properly, a clear area 24 having a width D of approximately 20 microns should be maintained so that no other metal deposits is allowed in the area. The total clear area required for metal target 20 is calculated to be approximately 160 micron$^2$. To avoid false readings from the laser scan, no metal objects can be tolerated in the clear area. The metal target 20 can be deposited on the surface of the IC chip by a conventionally known aluminum metalization process.

FIG. 3 shows a similar metal target 30 placed in the Y direction for the Y coordinate. Curve 32 is obtained by laser scanning showing the signal strength in the Y coordinate. The dimensions of the metal target 30, i.e. B, C and D are similar to those shown in FIG. 2 for metal target 20. An area 34 is provided as the clear area to avoid any interference by other metal deposits.

The present invention rectangular shaped metal target 20 and 30 as shown in FIGS. 2 and 3 each represents the X coordinate and the Y coordinate, respectively. Metal target 20 in the X coordinate supplies the X value of the reference coordinate to the laser repair apparatus, while metal target 30 in the Y coordinate supplies the Y value of the reference coordinate to the laser repair apparatus. By the Intersections of the response curves of 22 and 32, the reference coordinates of X and Y can be obtained.

EXAMPLE

Figure 4:
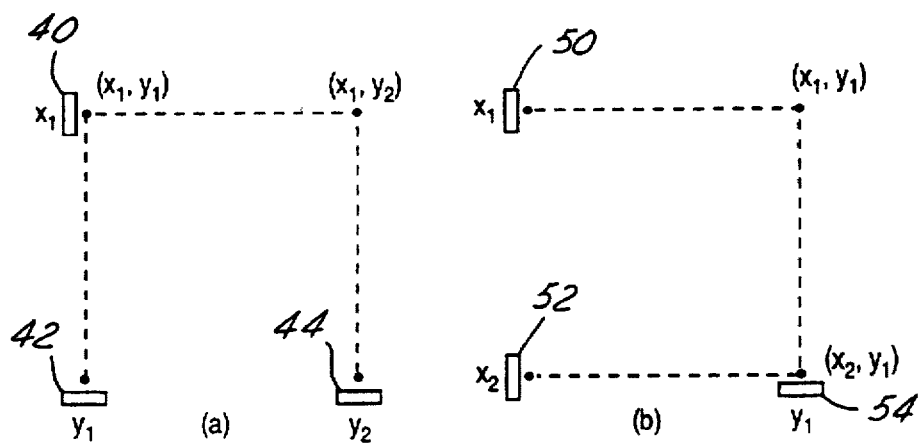
FIG. 4 is a schematic showing the placement of the present invention metal targets in the preferred embodiment and in the alternative embodiment.

FIG. 4(a) shows a preferred embodiment wherein a rectangular metal target 40 placed in the X direction, and two rectangular targets 42 and 44 placed in the Y direction are deposited on the surface of an IC chip. From these three metal targets, two sets of reference coordinates $X_1$, $Y_1$, and $X_1$, $Y_2$ can be obtained. These reference coordinates are used by the laser repair apparatus to calculate the actual coordinate of the designated repair sites such that the repair can be executed.

An alternative embodiment of the present invention is shown in FIG. 4(b). Two rectangular shaped metal targets 50 and 52 positioned in the X direction and one rectangular shaped metal target 54 positioned in the Y direction are deposited on the surface of an IC chip. A set of reference coordinates of $X_1$, $Y_1$, and $X_2$, $Y_1$ can be obtained as reference coordinates to enable the laser repair apparatus to calculate the actual coordinates of the designated repair sites.

Figure 1:
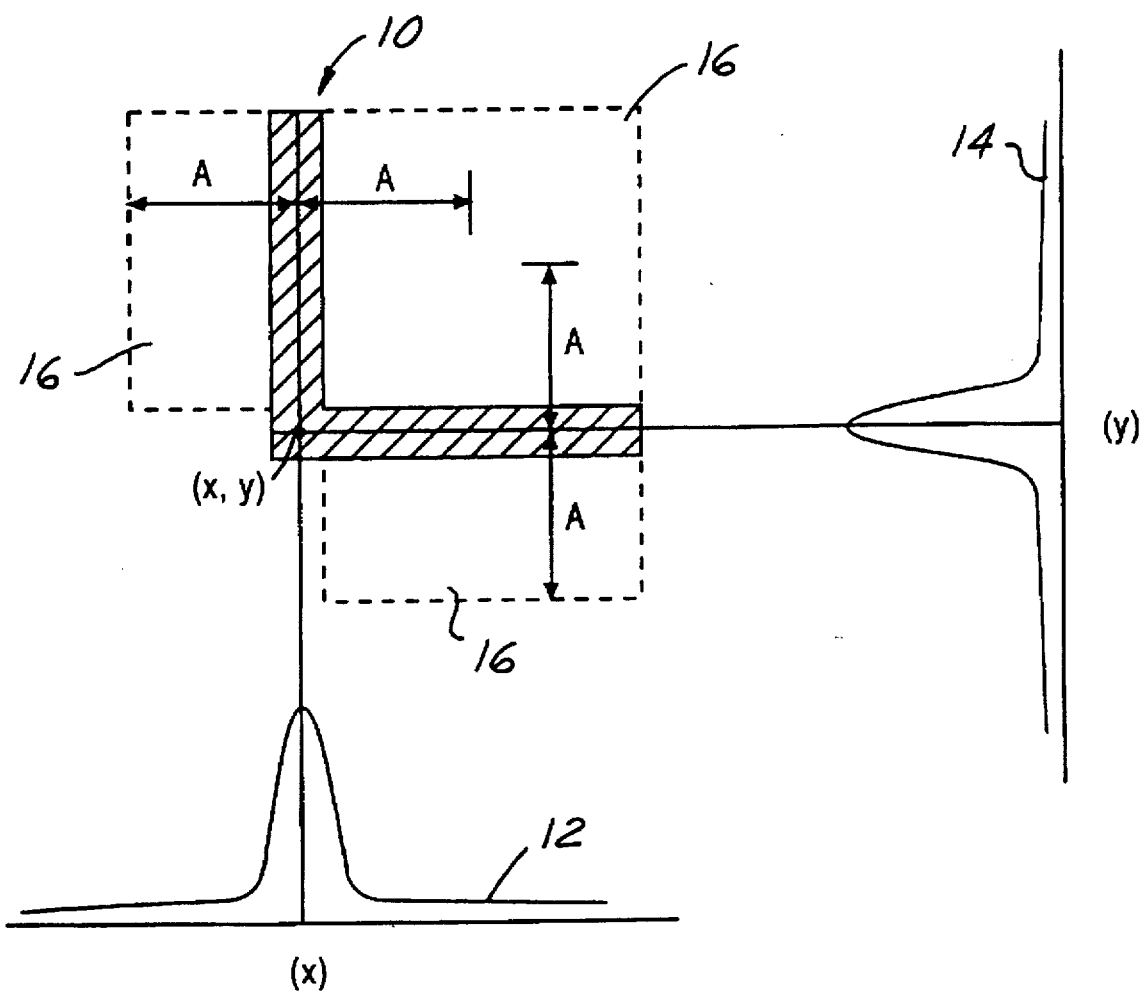
FIG. 1 is a plane view of an "L" shaped metal target and its corresponding laser scan graphs in the X and Y coordinate of a prior art method.

It is seen by comparing FIGS. 2 and 1, the space necessary for depositing a rectangular shaped target is much smaller than that needed to deposit an "L" shaped target. Furthermore, the clear area necessary for an "L" shaped target is also significantly larger than the clear area necessary for a rectangular shaped target. In the design of IC chips, it is therefore much easier to find a space to deposit a rectangular shaped target. Furthermore, during the laser scanning procedure, the total steps necessary to read the reference coordinates of a rectangular shaped target is less than that necessary for the "L" shaped target. As illustrated in the preferred and the alternative embodiments, when two sets of reference coordinates are needed, it requires two "L" shaped targets and two laser scanning actions each in the X and Y direction, i.e. a total of four scanning actions is necessary to generate two sets of reference coordinates. In contrary, the present invention rectangular shaped metal targets only requires the deposition of alternatively two targets in the X direction and one target in the Y direction, or alternatively two targets in the Y direction and one target in the X direction, and only a total number of three laser scanning actions is necessary. A 25% savings in processing time is therefore realized in the application of the present invention metal targets. This increases the production efficiency of a laser repair apparatus.

While the present invention has been described in an illustrative manner, it should be understood that the technology used is intended to be in a nature of words of description rather than of limitation.

Furthermore, while the present invention has been described in terms of a preferred embodiment thereof, it is to be appreciated that those skilled in the art will readily apply these teachings to other possible variations of the invention. For instance, other suitable dimensions of the rectangular metal target may easily substitute those shown in the preferred and the alternative embodiment while accomplishing essentially the same desirable results.

The embodiments of the invention in which an exclusive property or privilege is claimed are defined as follows:

1. A method of determining the coordinates of a repair site on the surface of an integrated circuit chip by a laser repair apparatus comprising the steps of:

depositing a first rectangular metal target on said surface in either the X or the Y coordinate, depositing at least two rectangular metal targets on said surface in a perpendicular direction to said first rectangular metal target, scanning with a laser beam and determining one or more reference coordinates of said metal targets, and calculating the actual coordinate of at least two repair sites from said one or more reference coordinates.

2. A method according to claim 1, wherein said metal targets deposited comprises aluminum.

3. A method according to claim 1, wherein said first rectangular shaped metal target is deposited in the X coordinate and two rectangular shaped metal targets are deposited in the Y coordinate.

4. A method according to claim 1, wherein said first rectangular shaped metal target is deposited in the Y coordinate and two rectangular shaped metal targets are deposited in the X coordinate.

* * * * *